US012484157B2

(12) United States Patent
Yoshioka et al.

(10) Patent No.: US 12,484,157 B2
(45) Date of Patent: Nov. 25, 2025

(54) ADHESIVE FOR PROVISIONALLY FIXING ELECTRONIC COMPONENT TO SOLDER PRECOAT AND METHOD FOR PRODUCING ELECTRONIC COMPONENT MOUNTED SUBSTRATE

(71) Applicant: Panasonic Intellectual Property Management Co., Ltd., Kadoma (JP)

(72) Inventors: Yuki Yoshioka, Fukuoka (JP); Tadahiko Sakai, Fukuoka (JP); Tadashi Maeda, Fukuoka (JP); Shingo Okamura, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 49 days.

(21) Appl. No.: 18/550,317

(22) PCT Filed: Oct. 7, 2021

(86) PCT No.: PCT/JP2021/037174
§ 371 (c)(1),
(2) Date: Sep. 13, 2023

(87) PCT Pub. No.: WO2022/195937
PCT Pub. Date: Sep. 22, 2022

(65) Prior Publication Data
US 2024/0196545 A1  Jun. 13, 2024

(30) Foreign Application Priority Data
Mar. 18, 2021 (JP) .................................. 2021-045031

(51) Int. Cl.
B23K 1/00 (2006.01)
B23K 1/20 (2006.01)
(Continued)

(52) U.S. Cl.
CPC ............ *H05K 3/305* (2013.01); *B23K 1/0016* (2013.01); *B23K 1/20* (2013.01); *C09J 11/06* (2013.01);
(Continued)

(58) Field of Classification Search
CPC ......... H01L 2924/014; H01L 2224/131; H01L 2224/0401; H01L 24/11; H01L 2924/181;
(Continued)

(56) References Cited

U.S. PATENT DOCUMENTS 3,740,831 A * 6/1973 Jordan ................. C07D 263/57
546/7
5,877,078 A * 3/1999 Yanagida ................ H01L 24/03
257/E23.021
(Continued)

FOREIGN PATENT DOCUMENTS

JP   H01-150493 A   6/1989
JP   H06-090079 A   3/1994
(Continued)

OTHER PUBLICATIONS

International Search Report and Written Opinion issued in Patent Application No. PCT/JP2021/037174 dated Dec. 7, 2021.
(Continued)

*Primary Examiner* — Erin B Saad
(74) *Attorney, Agent, or Firm* — MCDONALD HOPKINS LLC

(57) ABSTRACT

An adhesive for temporarily fixing an electronic component to a solder precoat covered at least partially with an organic film, the adhesive including a principal resin, and a solvent dissolving the principal resin. The content of the solvent is 25 mass % or more and 40 mass % or less, and the organic film dissolves in the solvent when the solder precoat is melted. According thereto, the formation of an oxide film on
(Continued)

the surface of the solder precoat can be suppressed, and poor connection between the electrode having the solder precoat and the electronic component can be suppressed.

6 Claims, 5 Drawing Sheets

(51) Int. Cl.
| | |
|---|---|
| *C09J 11/06* | (2006.01) |
| *C09J 193/04* | (2006.01) |
| *H05K 3/30* | (2006.01) |
| *H05K 3/34* | (2006.01) |
| *B23K 101/42* | (2006.01) |

(52) U.S. Cl.
CPC .......... *C09J 193/04* (2013.01); *H05K 3/3442* (2013.01); *B23K 2101/42* (2018.08)

(58) Field of Classification Search
CPC ................ H05K 3/3489; H05K 1/113; H05K 2201/0215; H05K 2201/035; H05K 2203/0392; B23K 35/025; B23K 1/0016; B23K 35/0244; B23K 35/36; B23K 35/362

See application file for complete search history.

(56) References Cited

U.S. PATENT DOCUMENTS

| | | | | |
|---|---|---|---|---|
| 7,052,558 | B1* | 5/2006 | Sabarese | B23K 35/025 148/23 |
| 2002/0092163 | A1* | 7/2002 | Fraivillig | H05K 3/0097 29/846 |
| 2005/0056687 | A1 | 3/2005 | Matsumoto et al. | |
| 2005/0284921 | A1* | 12/2005 | Sakai | H01L 24/11 257/E21.511 |
| 2008/0244900 | A1* | 10/2008 | Maeda | H01L 24/11 257/E21.511 |
| 2014/0096379 | A1* | 4/2014 | Saeki | H05K 3/3494 29/832 |
| 2015/0034701 | A1* | 2/2015 | Takaoka | H01G 4/248 228/101 |
| 2015/0092356 | A1* | 4/2015 | Yoshikawa | H05K 3/4007 174/258 |
| 2015/0116968 | A1* | 4/2015 | Yamada | H01L 23/49894 361/767 |
| 2019/0284388 | A1* | 9/2019 | Yoshioka | C08G 59/50 |
| 2020/0303293 | A1* | 9/2020 | Machida | H01L 23/49894 |
| 2021/0060713 | A1* | 3/2021 | Kawanago | B23K 35/362 |

FOREIGN PATENT DOCUMENTS

| | | |
|---|---|---|
| JP | H07-183650 A | 7/1995 |
| JP | H08-250848 A | 9/1996 |
| JP | 2002-283097 A | 10/2002 |
| JP | 2005-059028 A | 3/2005 |
| JP | 2007-207868 A | 8/2007 |
| JP | 2011-228608 A | 11/2011 |

OTHER PUBLICATIONS

Japanese Office Action issued in Japanese Patent Application No. 2023-506725 dated Sep. 24, 2025.

* cited by examiner

ADHESIVE FOR PROVISIONALLY FIXING ELECTRONIC COMPONENT TO SOLDER PRECOAT AND METHOD FOR PRODUCING ELECTRONIC COMPONENT MOUNTED SUBSTRATE

TECHNICAL FIELD

The present invention relates to an adhesive for temporarily fixing an electronic component to a solder precoat, and a method for producing an electronic component mounting substrate.

BACKGROUND ART

Patent Literature 1 proposes a method for mounting an electronic component on a printed circuit board, the method including: with respect to a printed circuit board (1) having a fine-pitch pad part (5) with a pad-to-pad pitch of less than 0.5 mm and a rough-pitch pad part (4) with a pad-to-pad pitch of 0.5 mm or more, printing a solder paste (8) on a pad (3) of the rough-pitch pad part (4); applying a solder deposition composition (12) containing an organic acid lead salt and tin powder as major components, all over the fine-pitch pad part (5); heating the printed circuit board (1), to melt the solder paste (8) so that a solder layer (13) is formed on the pad (3) of the rough-pitch pad part (4), as well as to allow a solder to be precipitated from the solder deposition composition (12) so that a solder layer (13) is formed on a pad (3) of the fine-pitch pad part (5); applying a flux (15) onto the printed circuit board (1), and placing an electronic component (16) thereon so that leads (17) are temporarily fixed to the solder layers (13) on the pads (3) by adhesive force of the flux (15); and heating the printed circuit board (1) with the electronic component (16) placed thereon, to melt the solder layers (13) so that the leads (17) of the electronic component (16) are soldered to the pads (3).

CITATION LIST

Patent Literature

Patent Literature 1: Japanese Laid-Open Patent Publication No. H06-90079

SUMMARY OF INVENTION

Technical Problem

With miniaturization of electronic components, development of finer solder precoats is in progress. A fine solder precoat has a large surface area relative to the volume of the solder, and is susceptible to the influence by an oxide film formed on the surface, tending to cause poor connection between the electrode and the electronic component. The formation of an oxide film can be suppressed by attaching an organic material, such as an antioxidant, onto the surface of the solder precoat; however, the organic material may rather be a cause of poor connection between the electrode and the electronic component.

Solution to Problem

One aspect of the present invention relates to an adhesive for temporarily fixing an electronic component to a solder precoat covered at least partially with an organic film, the adhesive including: a principal resin; and a solvent dissolving the principal resin, wherein a content of the solvent is 25 mass % or more and 40 mass % or less, and the organic film dissolves in the solvent when the solder precoat is melted.

Another aspect of the present invention relates to a method for producing an electronic component mounting substrate, including steps of: preparing a circuit member having a solder precoat covered at least partially with an organic film; applying an adhesive for temporarily fixing an electronic component on the solder precoat, so as to cover at least part of the organic film; placing the electronic component on the solder precoat, with the adhesive interposed between the electronic component and the solder precoat; and reflowing the solder precoat, to mount the electronic component on the circuit member; wherein the adhesive includes a principal resin, and a solvent dissolving the principal resin, a content of the solvent is 25 mass % or more and 40 mass % or less, and the organic film dissolves in the solvent when the solder precoat is reflowed.

Advantageous Effects of Invention

According to the present invention, the formation of an oxide film on the surface of the solder precoat can be suppressed, and poor connection between the electrode having the solder precoat and the electronic component can be suppressed.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF EMBODIMENTS

Figure 1:
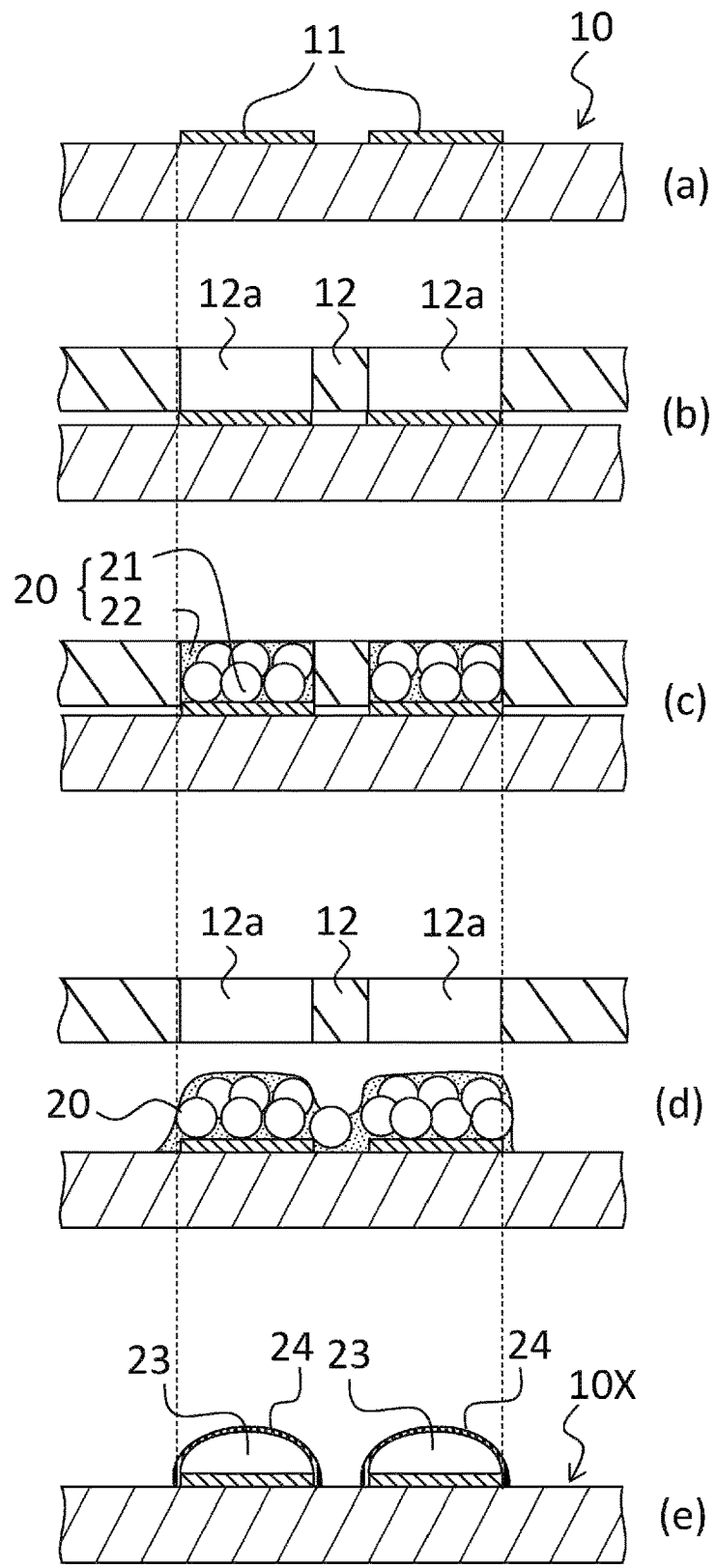
FIG. 1 A schematic diagram illustrating a process of forming a solder precoat on a circuit member.

In the following, embodiments of the present invention will be described by way of examples. It is to be noted however that the present invention is not limited to the examples described below.

An adhesive according to the present embodiment is an adhesive for temporarily fixing an electronic component to a solder precoat covered at least partially with an organic film. The solder precoat does not have adhesiveness like that of cream solders or solder pastes. Therefore, an adhesive is applied onto the solder precoat in order to impart adhesiveness thereto. An electronic component is placed on the solder precoat, with the adhesive interposed therebetween.

Next, a method for producing an electronic component mounting substrate according to the present invention includes a step of preparing a circuit member having a solder precoat covered at least partially with an organic film, a step of applying the aforementioned adhesive for temporarily fixing an electronic component on the solder precoat, so as to cover at least part of the organic film, a step of placing the electronic component on the solder precoat, with the adhesive interposed therebetween, and a step of reflowing the solder precoat, to mount the electronic component on the circuit member.

The circuit member may be, for example, a substrate, such as a laminated substrate, a resin substrate, a ceramic substrate, or a silicon substrate, a semiconductor element, a semiconductor package, and the like. The circuit member may also be, for example, a structured body formed of one of various substrates and a semiconductor package mounted thereon. Examples of the structured body include chip-on-board, chip-on-film, chip-on-glass, chip-on-chip, chip-on-package, and package-on-package.

The organic film covering at least part of the solder precoat may be any film that contains an organic material. The "film" of the organic film is not necessarily limited to a homogeneous and dense film, and encompasses a broad concept that includes a coating, a layer, a deposit, and the like that covers in various forms at least part of the surface of the solder precoat. The organic film can be rephrased as an organic material adhering to the surface of the solder precoat, an organic material covering at least part of the surface of the solder precoat, and the like. The substantially whole (e.g., 99 mass % or more) of the organic film may be constituted only of the organic material.

The organic material has a function of inhibiting contact between the solder precoat and oxygen. The organic material blocks oxygen, and thus, the formation of an oxide film at the surface of the solder precoat is suppressed.

The organic film may be a residue produced during formation of the solder precoat. The solder precoat is formed by supplying a solder paste containing solder particles and a flux onto an electrode (e.g., pad, land) provided on the circuit member, and then, heating the solder paste. The heating melts the solder particles in the solder paste, allowing a solder to adhere in the form of a film, onto the electrode surface. When the solder is solidified, a solder precoat is formed, and the surface of the solder precoat is covered with a residue of the flux. That is, the residue produced during formation of the solder precoat is a residue of the flux.

The residue contains an organic material derived from the flux, and has a function of inhibiting contact between the solder precoat and oxygen. The residue can contain, for example, a resin described later as a principal resin of the adhesive or a thermally modified product thereof, as a major component. The major component means a component that can account for 30 mass % or more, further 50 mass % or more of the residue.

The residue produced during formation of the solder precoat is, usually, removed by cleaning. In the case, however, where the residue is not removed and used as an organic film covering at least part of the solder precoat, the cleaning process can be omitted.

(Adhesive)

The adhesive includes a principal resin and a solvent dissolving the principal resin. The content of the solvent in the adhesive is 25 mass % or more and 40 mass % or less. The organic film dissolves in the solvent when the solder precoat is melted. In other words, the solvent is selected so as to be able to dissolve the organic film when the solder precoat is melted.

Part of the solvent is volatilized by the heat during reflowing of the solder precoat. On the other hand, the organic film is softened or melted by the heat during reflowing of the solder precoat. When the adhesive contains 25 mass % or more of the solvent, even during reflowing of the solder precoat, a sufficient amount of the solvent for dissolving the softened or melted organic film will be present in the adhesive.

When the softened or melted organic film dissolves in the solvent, the principal resin and the organic film dissolved in the solvent can be compatibilized with each other. When the organic film and the principal resin are compatibilized with each other before most of the solvent evaporates, the organic material constituting the organic film tends to be separated, together with the principal resin, from the molten solder formed by reflow. That is, the organic film is less likely to remain on the surface of the solder precoat. On the other hand, the molten solder wets and spreads over the electrode covered with the solder precoat and over the electrode of the electronic component, to form a joint portion therebetween. As a result, poor connection due to the organic film is suppressed.

On the other hand, when the adhesive contains 40 mass % or less of the solvent, adhesiveness or tackiness sufficient for temporarily fixing the electronic component onto the solder precoat is ensured. In order to ensure the adhesiveness or tackiness of the adhesive, it is necessary to suppress the content of the solvent in the adhesive to 40 mass % or less.

When the electronic component is, for example, equal to or smaller than the 0402 size (e.g., 0402, 0201, 03015, 01005 size) of the JIS standards (Japanese Industrial Standards), without sufficient adhesiveness or tackiness of the adhesive, due to the static electricity or other causes, the electronic component may fail to be separated from a transfer means (e.g., a placement head) for picking up the electronic component and carrying it onto the solder precoat of the circuit member, which may result in a mounting defect. Moreover, without sufficient adhesiveness or tackiness of the adhesive, no matter how miniature the electronic component is, due to vibration during the transportation of the circuit member with the electronic component placed thereon into a reflow apparatus for reflowing the solder precoat, the electronic component may be misaligned. When the content of the solvent in the adhesive is controlled to 40 mass % or less, such a mounting defect and misalignment of miniature components can be suppressed. In other words, the adhesive according to the present embodiment is particularly suitable for temporarily fixing an electronic component equal to or smaller than the 0402 size defined in the JIS standards, to a solder precoat.

The tackiness of the adhesive can be evaluated by the adhesive force of the adhesive measured by an adhesiveness test method for solder paste defined in JIS Z 3284-3. The adhesive force can be measured using a commercially available tack force tester. When the obtained numerical value (gf) is converted to N, the adhesive force is desirably 0.5 N or more, and the adhesive force of 1.0 N or more is more desirable. The higher the content of the solvent in the adhesive is, the lower the adhesive force of the adhesive becomes. Note that, however, when the size of the electronic component is equal to or smaller than 0402, a sufficient adhesive force can be achieved even with the solvent content of 25 mass % or more and 40 mass % or less.

As the principal resin, for example, a rosin-based resin that itself has reducing properties is preferably used, but resins other than the rosin-based resin can also be used. The principal resin may be used singly or in combination of two or more kinds. Among the materials mentioned below, for example, a rosin-based resin, an acrylic resin, a polyethylene glycol, and the like are desirable, but there is no particular limitation.

Examples of the rosin-based resin include natural rosin, such as gum rosin and wood rosin, and derivatives thereof (e.g., polymerized rosin, hydrogenated rosin, disproportionated rosin, acid-modified rosin, rosin ester).

As a resin other than the rosin-based resin, for example, an organic fatty acid ester, a polyalkylene oxide-based resin, a propylene glycol fatty acid ester, and acetylene glycols can be used. Specific examples thereof include an organic fatty acid polyglycerol ester, such as lauric acid polyglycerol ester, stearic acid polyglycerol ester, isostearic acid polyglycerol ester, sesquistearic acid polyglycerol ester, diisostearic acid polyglycerol ester, myristic acid polyglycerol ester, palmitic acid polyglycerol ester, oleic acid polyglycerol ester, behenic acid polyglycerol ester, and caprylic acid polyglycerol ester, polyethylene glycol, a polyethylene glycol-polypropylene glycol copolymer, polyoxyethylene alkyl ester, polyoxyethylene tallow ester, polyglycerin, glycerin fatty acid ester, polyglycerin fatty acid ester, sorbitan fatty acid ester, propylene glycol fatty acid esters, and acetylene glycols, such as 2,4,7,9-tetramethyl-5-decyne-4,7-diol-ethylene oxide adduct.

As the resin other than the rosin-based resin, the following can also be used: a terpene resin, a terpene phenol resin, a styrene resin, a xylene resin, an acrylic resin, a polyester resin, a polyolefin resin, a polyamide, a polyamine, a phenol resin, a phenoxy resin, an epoxy resin, and the like. Examples of the terpene resin include an aromatic modified terpene resin, a hydrogenated terpene resin, and a hydrogenated aromatic modified terpene resin. Examples of the terpene phenol resin include a hydrogenated terpene phenol resin. Examples of the styrene resin include a styrene-acrylic acid copolymer, and a styrene-maleic acid copolymer. Examples of the xylene resin include a phenol-modified xylene resin, an alkylphenol-modified xylene resin, a phenol-modified resol-type xylene resin, a polyol-modified xylene resin, and a polyoxyethylene-added xylene resin. Examples of the acrylic resin include an acrylic acid, a methacrylic acid, various esters of acrylic acid, various esters of methacrylic acid, a crotonic acid, an itaconic acid, a maleic acid, a maleic anhydride, an ester of maleic acid, an ester of maleic anhydride ester, and an acrylic resin obtained by copolymerizing at least one monomer selected from acrylonitrile, methacrylonitrile, acrylamide, methacrylamide, vinyl chloride, and vinyl acetate. Examples of the polyolefin resin include a polyethylene and a polypropylene. Examples of the epoxy resin include a bisphenol A-type epoxy resin, a bisphenol F-type epoxy resin, and a bisphenol AD-type epoxy resin.

As the solvent, for example, water, an alcohol-based solvent, a glycol-based solvent, a ketone-based solvent, a hydrocarbon-based solvent, an ester-based solvent, a glycol ether-based solvent, terpineols, and the like can be used. The solvent may be used singly or in combination of two or more kinds.

Examples of the alcohol-based solvent include isopropyl alcohol, 1,2-butanediol, isobornylcyclohexanol, 2,4-diethyl-1,5-pentanediol, 2,2-dimethyl-1,3-propanediol, 2,5-dimethyl-2,5-hexanediol, 2,5-dimethyl-3-hexyne-2,5-diol, 2,3-dimethyl-2,3-butanediol, 1,1,1-tris(hydroxymethyl)ethane, 2-ethyl-2-hydroxymethyl-1,3-propanediol, 2,2'-oxybis(methylene)bis(2-ethyl-1,3-propanediol), 2,2-bis(hydroxymethyl)-1,3-propanediol, 1,2,6-trihydroxyhexane, bis[2,2,2-tris(hydroxymethyl)ethyl]ether, 1-ethynyl-1-cyclohexanol, 1,4-cyclohexanediol, 1,4-cyclohexanedimethanol, erythritol, threitol, guaiacol glycerol ether, 3,6-dimethyl-4-octyne-3,6-diol, and 2,4,7,9-tetramethyl-5-decyne-4,7-diol.

Examples of the glycol-based solvent include ethylene glycol monomethyl ether, triethylene glycol monomethyl ether, polyethylene glycol monomethyl ether (295° C.), triethylene glycol monobutyl ether, diethylene glycol monohexyl ether (hexyl carbitol), diethylene glycol mono-2-ethylhexyl ether, ethylene glycol monophenyl ether, diethylene glycol monophenyl ether, ethylene glycol monobenzyl ether, diethylene glycol monobenzyl ether, diethylene glycol dibutyl ether, tripropylene glycol monoethyl ether, tripropylene glycol monobutyl ether, propylene glycol monophenyl ether, diethylene glycol dibutyl ether, tetraethylene glycol dimethyl ether, 2-methylpentane-2,4-diol, and triethylene glycol monobutyl ether.

Examples of the ketone-based solvent include methyl ethyl ketone, methyl-n-propyl ketone, diethyl ketone, and cyclohexanone.

Examples of the hydrocarbon-based solvent include normal hexane, isohexane, cyclohexane, methyl cyclohexane, ethyl cyclohexane, normal heptane, isoheptane, normal octane, isooctane, limonene, 2-methyl-2-butene, 2-methyl-1-pentene, 2-methyl-2-pentene, 3-ethyl-2-butene, 2,3-dimethyl-2-butene, 2,4,4-trimethyl-1-pentene, and 2,4,4-trimethyl-2-pentene.

Examples of the ester-based solvent include butyl stearate, 2-ethylhexyl stearate, isotridecyl stearate, methyl oleate, isobutyl oleate, methyl cocoate, methyl laurate, isopropyl myristate, isopropyl palmitate, 2-ethylhexyl palmitate, and octyldodecyl myristate.

The adhesive may further contain, in addition to the principal resin and the solvent, an activator that reduces the oxide film covering the surface of the solder precoat. At least part or all of the surface of the solder precoat is covered with the organic film, but it is impossible to completely inhibit the formation of an oxide film. On the surface of the solder precoat, an oxide film is inevitably present. The activator reduces the oxide film and aids the formation of favorable joint portions. Examples of the activator having a reducing action include an organic acid, an amine, and a halide. The activator may be used singly or in combination of two or more kinds.

Examples of the organic acid include succinic acid, glutaric acid, adipic acid, pimelic acid, suberic acid, azelaic acid, sebacic acid, dimer acid, propionic acid, 2,2-bishydroxymethylpropionic acid, tartaric acid, malic acid, glycolic acid, diglycolic acid, thioglycolic acid, dithioglycolic acid, stearic acid, 12-hydroxystearic acid, palmitic acid, and oleic acid.

Examples of the amine include ethylamine, triethylamine, ethylenediamine, triethylenetetramine, 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethyl imidazole, 2,3-dihydro-1H-pyrrolo[1,2-a]benzimidazole, 1-dodecyl-2-methyl-3-benzylimidazolium chloride, 2-methylimidazoline, 2-phenylimidazoline, 2,4-diamino-6-vinyl-s-triazine, 2,4-diamino-6-vinyl-s-triazine isocyanuric acid adduct, 2,4-diamino-6-methacryloyloxyethyl-s-triazine, epoxy-imidazole adduct, 2-methylbenzimidazole, 2-octylbenzimidazole, 2-pentylbenzimidazole, 2-(1-ethylpentyl)benzimidazole, 2-nonylbenzimidazole, 2-(4-thiazolyl)benzimidazole, benzimidazole, 2-(2'-hydroxy-5'-methylphenyl)benzotriazole, 2-(2'-hydroxy-3'-tert-butyl-5'-methylphenyl)-5-chlorobenzotriazole, 2-(2'-hydroxy-3',5'-di-tert-amylphenyl)benzotriazole, 2-(2'-hydroxy-5'-tert-octylphenyl)benzotriazole, 2,2'-methylenebis[6-(2H-benzotriazole-2-yl)-4-tert-octylphenol], 6-(2-benzotriazolyl)-4-tert-octyl-6'-tert-butyl-4'-methyl-2,2'-methylenebisphenol, 1,2,3-benzotriazole, 1-[N,N-bis(2-ethylhexyl)aminomethyl]benzotriazole, carboxybenzotriazole, 1-[N,N-bis(2-ethylhexyl)aminomethyl]methylbenzotriazole, 2,2'-[[(methyl-1H-benzotriazol-1-yl)methyl]imino]bisethanol, 1-(1',2'-dicarboxyethyl)benzotriazole, 1-(2,3-dicarboxypropyl)benzotriazole, 1-[(2-ethylhexylamino)methyl]benzotriazole, 2,6-bis[(1H-benzotriazol-1-yl)methyl]-4-methylphenol, 5-methylbenzotriazole, and 5-phenyltetrazole.

Examples of the halide include an amine hydrohalide, and an organic halogen compound. Examples of the amine constituting the amine hydrohalide include ethylamine, ethylenediamine, triethylamine, diphenylguanidine, ditolylguanidine, methylimidazole, and 2-ethyl-4-methylimidazole. Examples of the hydrogen halide include hydrogen chloride, hydrogen bromide, and hydrogen iodide. Examples of the organic halogen compound include trans-2,3-dibromo-2-butene-1,4-diol, triallyl isocyanurate hexabromide, 1-bromo-2-butanol, 1-bromo-2-propanol, 3-bromo-1-propanol, 3-bromo-1,2-propanediol, 1,4-dibromo-2-butanol, 1,3-dibromo-2-propanol, 2,3-dibromo-1-propanol, 2, 3-dibromo-1,4-butanediol, and 2,3-dibromo-2-butene-1,4-diol.

The adhesive may contain a thixotropic agent (thixotropy-imparting agent). As the thixotropic agent, a wax-based thixotropic agent, an amide-based thixotropic agent, a sorbitol-based thixotropic agent, and the like can be used. Examples of the wax-based thixotropic agent include hardened castor oil. Examples of the amide-based thixotropic agent include lauric acid amide, palmitic acid amide, stearic acid amide, behenic acid amide, hydroxystearic acid amide, saturated fatty acid amide, oleic acid amide, erucic acid amide, unsaturated fatty acid amide, p-toluenemethanamide, aromatic amide, methylene bis stearic acid amide, ethylene bis lauric acid amide, ethylene bis hydroxystearic acid amide, saturated fatty acid bisamide, methylene bis oleic acid amide, unsaturated fatty acid bisamide, m-xylylene bis stearate amide, aromatic bisamide, saturated fatty acid polyamide, unsaturated fatty acid polyamide, aromatic polyamide, substituted amide, methylol stearic acid amide, methylolamide, and fatty acid ester amide. Examples of the sorbitol thixotropic agent include dibenzylidene-D-sorbitol, and bis(4-methylbenzylidene)-D-sorbitol. The thixotropic agent may be used singly or in combination of two or more kinds.

The adhesive can further contain, for example, a surfactant, a silane coupling agent, an antioxidant (e.g., an antioxidant that can be contained in the organic film), a colorant, and the like.

(Organic Film)

When the organic film contains, as an organic material, a residue (i.e., residue of flux) produced during formation of the solder precoat, the residue can contain, for example, the principal resin that can be contained in the adhesive or a thermally modified product thereof, as a major component.

When the organic film contains, as an organic material, a residue produced during formation of the solder precoat, the solvent that can be desirably used is at least one selected from the group consisting of an alcohol-based solvent, an ester-based solvent, a glycol-based solvent, a ketone-based solvent, and a hydrocarbon-based solvent, in term of the compatibility between the organic film and the principal resin.

The organic material, for example, may be an antioxidant, may be an organic acid, and may be an organic fatty acid ester. The antioxidant may be a phenolic antioxidant, an amine-based antioxidant, a phosphoric acid-series antioxidant, a sulfur-containing antioxidant, and the like. These organic materials may be used singly or in combination of two or more kinds.

When the organic film contains, as an organic material, a phenolic antioxidant and/or a phosphoric acid-series antioxidant, the solvent that can be desirably used is at least one selected from the group consisting of an alcohol-based solvent, a glycol-based solvent, and a ketone-based solvent, in terms of the compatibility between the organic film and the principal resin.

When the organic film contains, as an organic material, an amine-based antioxidant and/or a sulfur-containing antioxidant, the solvent that can be desirably used is at least one selected from the group consisting of an alcohol-based solvent, a glycol-based solvent, and a hydrocarbon-based solvent, in terms of the compatibility between the organic film and the principal resin.

When the organic film contains, as an organic material, an organic fatty acid, the solvent that can be desirably used is at least one selected from the group consisting of an alcohol-based solvent, a glycol-based solvent, a ketone-based solvent, and a hydrocarbon-based solvent, in terms of the compatibility between the organic film and the principal resin.

The phenolic antioxidant is exemplified by, for example, a hindered phenolic compound having a bulky substituent (e.g., a branched or cyclic alkyl group, such as t-butyl group) at at least one of the ortho positions of phenol. Specific examples thereof include bis[3-(3-tert-butyl-4-hydroxy-5-methylphenyl)propionic acid][ethylenebis(oxyethylene)], N,N'-hexamethylenebis[3-(3,5-di-tert-butyl-4-hydroxyphenyl)propanamide], 1,6-hexanediolbis[3-(3,5-di-tert-butyl-4-hydroxyphenyl)propionate], 2,2'-methylenebis[6-(1-methylcyclohexyl)-p-cresol], 2,2'-methylenebis(6-tert-butyl-p-cresol), 2,2'-methylenebis(6-tert-butyl-4-ethylphenol), triethylene glycol-bis[3-(3-tert-butyl-5-methyl-4-hydroxyphenyl)propionate], 1,6-hexanediol-bis-[3-(3,5-di-tert-butyl-4-hydroxyphenyl)propionate], 2,4-bis-(n-octylthio)-6-(4-hydroxy-3,5-di-t-butylanilino)-1,3,5-triazine, pentaerythrityl-tetrakis[3-(3,5-di-tert-butyl-4-hydroxyphenyl)propionate], 2,2-thio-diethylenebis[3-(3,5-di-tert-butyl-4-hydroxyphenyl)propionate], octadecyl-3-(3,5-di-tert-butyl-4-hydroxyphenyl)propionate, N,N'-hexamethylenebis (3,5-di-t-butyl-4-hydroxy-hydrocinnamamide), 3,5-di-tert-butyl-4-hydroxybenzylphosphonate-diethyl ester, 1,3,5-trimethyl-2,4,6-tris(3,5-di-tert-butyl-4-hydroxybenzyl) benzene, and N,N'-bis[2-[2-(3,5-di-tert-butyl-4-hydroxyphenyl)ethylcarbonyloxy]ethyl]oxamide.

Examples of the amine-based antioxidant include alkylated diphenylamine, tris-(3,5-di-t-butyl-4-hydroxybenzyl)-isocyanurate, N,N-di-sec-butyl-p-phenylenediamine, p-phenylenediamine derivatives, and 1,3,5-tris(4-t-butyl-3-hydroxy-2,6-dimethyl)isocyanurate.

Examples of the phosphoric acid-series antioxidant include tris-nonylphenyl phosphite, triphenyl phosphite, tris(2,4-di-t-butylphenyl)phosphite, and tris(isodecyl)phosphite.

Examples of the sulfur-containing antioxidant include 2,4-bis[(octylthio)methyl]-o-cresol, dilauryl-3,3-thiodipropionate, dimyristyl-3,3-thiodipropionate, distearyl-3,3-thiodipropionate, pentaerythrityltetrakis(3-laurylthiopropionate), ditridecyl-3,3-thiodipropionate, 2-mercaptobenzimidazole, and bis[2-methyl-4-(3-n-alkylthiopropionyloxy)-5-t-butylphenyl]sulfide.

The organic acid includes, for example, the organic acids exemplified as the activator having a reducing action that can be contained in the adhesive.

The organic fatty acid ester includes, for example, the organic fatty acid esters that can be contained as a principal resin in the adhesive.

Next, a method for producing an electronic component mounting substrate according to the present embodiment will be described with reference to the drawings. Note that, in the drawings, component members are illustrated in relative dimensions in order to clarify the shape or feature thereof, and do not necessarily represent the actual dimensions. In the drawings, the same constituent members are denoted by the same reference numerals.

(First Step)

First, a circuit member provided with a solder precoat which is covered at least partially with an organic film is prepared. FIG. 1 is a schematic diagram illustrating a step of forming a solder precoat on a circuit member.

FIG. 1(a) illustrates, in a cross section, an essential part of a circuit member 10. The circuit member 10 is a circuit board having a miniature electrode 11 (land or pad).

FIGS. 1(b) to (d) illustrate a solder paste application process. A solder paste 20 is applied onto the circuit member 10 at predetermined positions by, for example, a printing method.

FIG. 1(b) illustrates a state where a mask 12 having an opening 12a corresponding to the electrode 11 is positioned on the circuit member 10. For the mask 12, for example, a screen mask can be used.

Next, as illustrated in FIG. 1(c), the solder paste 20 is applied onto the circuit member 10 through the mask 12. The solder paste 20 contains solder particles 21 and a flux 22. The particle diameter of the solder particles is smaller than the size of the opening 12a of the mask 12, and may be, for example, 20 m or less, but is not limited thereto.

As illustrated in FIG. 1(d), when the mask 12 is retracted from the circuit member 10, the circuit member 10 with the solder paste 20 applied on the electrode 11 is obtained. At this point, the solder paste 20 may bridge between the electrodes 11 in closest proximity to each other. In this state, the circuit member 10 is heated to a melting temperature of the solder particles 21.

When the solder particles 21 are melted, molten solder wets and spreads in the form of a film over the electrode surface, and adheres thereon. At this time, the solder present in the space between the electrodes 11 is attracted to the surfaces of the electrodes 11 by the surface tension of the molten solder. When the solder is allowed to cool to solidify, a circuit member 10X having a solder precoat 23 is obtained as illustrated in in FIG. 1(e). The surface of the solder precoat 23 is covered with an organic film 24 containing a residue of the flux. Due to the surface tension of the molten solder, the solder precoat 23 has a shape having a curved surface which is convex toward the organic film 24 (i.e., convex upward on the sheet). The curvature of the curved surface of the solder precoat 23 increases as the area per one electrode 11 decreases.

(Second Step)

Figure 2:
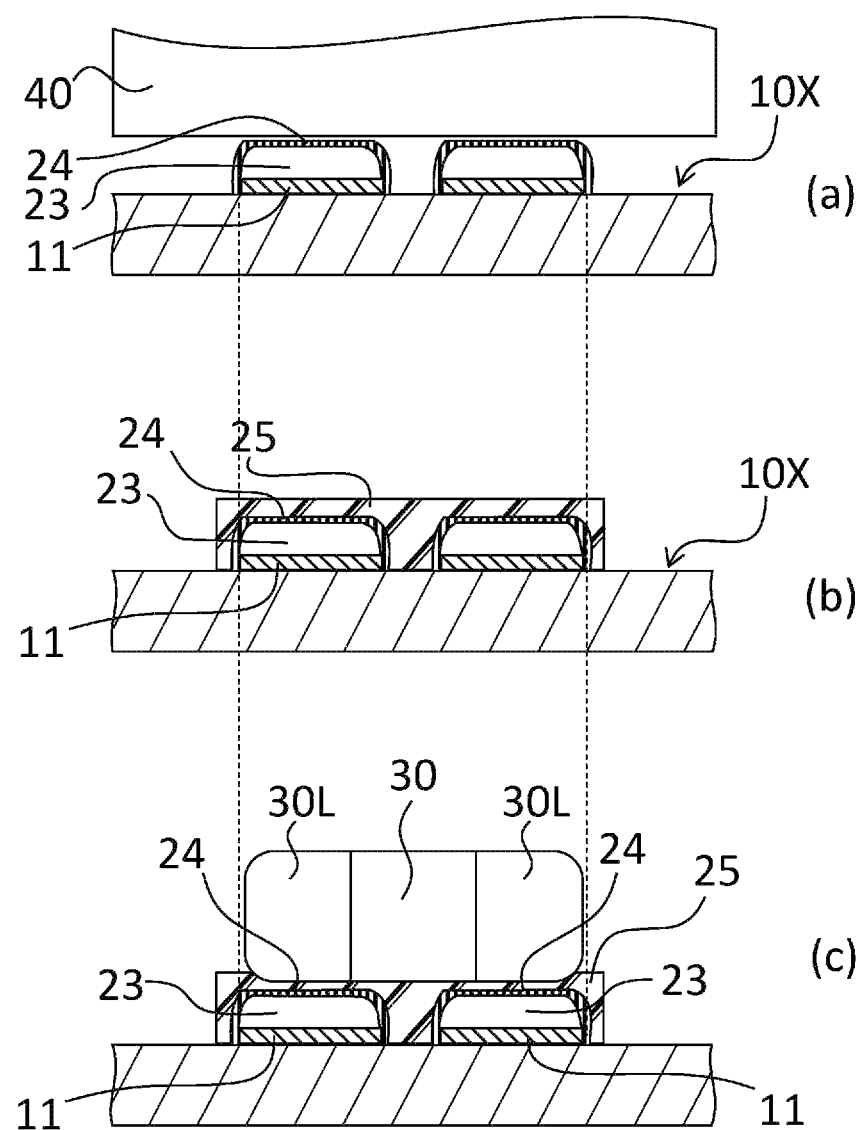
FIG. 2 A schematic diagram illustrating part of a process of mounting an electronic component on the circuit member having a solder precoat.

Next, an adhesive 25 for temporarily fixing an electronic component is applied onto the solder precoat 23 so as to cover at least part of the organic film 24, and an electronic component 30 is placed on the solder precoat 23, with the adhesive 25 interposed therebetween. FIG. 2 is a schematic diagram illustrating a step of applying the adhesive 25 onto the solder precoat 23, and then placing the electronic component 30 on the circuit member 10X.

FIG. 2(a) illustrates a step of pressing the solder precoat 23 having an upward-convex curved surface and covered with the organic film 24, against the circuit member 10X with a jig 40 having a flat pressing surface. Since the upward-convex curved surface is compressed and flattened by pressing, the solder precoat 23 is formed into a shape suitable for placing the electronic component 30 stably thereon. At the same time, although not shown, the organic film 24 cracks or the organic film 24 partially peels off from the solder precoat 23, to partially expose the surface of the solder precoat 23. This facilitates the contact between the adhesive 25 and the solder precoat 23, and when the adhesive has reducing properties, allows the reducing action to easily develop.

FIG. 2(b) illustrates a state where the adhesive 25 is applied onto the solder precoat 23 flattened and covered with the organic film 24. The adhesive 25 is applied onto the solder precoat 23 of the circuit member 10X, with the organic film 24 interposed therebetween by, for example, a printing method. That is, although not shown, with a mask having an opening corresponding to the solder precoat 23 overlapped on the circuit member 10X, the adhesive 25 is applied onto the circuit member 10X through the mask, and then, the mask is retracted from the circuit member 10X. This gives the circuit member 10X in which the adhesive 25 is applied onto the solder precoat 23, with the organic film 24 interposed therebetween. The adhesive 25 may bridge between the electrodes 11 in closest proximity to each other, as illustrated in FIG. 2(b).

FIG. 2(c) illustrates the circuit member 10X in which an electronic component 30 is mounted on the solder precoat 23, with the organic film 24 and the adhesive 25 interposed therebetween. The adhesive 25 serves to temporarily fix the electronic component 30 on the solder precoat 23 until the electronic component 30 is mounted on the circuit member 10X by reflow. In the illustrated example, the electronic component 30 is a chip component having a pair of lead terminals 30L on the left and right sides on the sheet. The pair of lead terminals 30L are aligned so as to be respectively joined to a pair of adjacent electrodes 11.

(Third Step)

Figure 3:
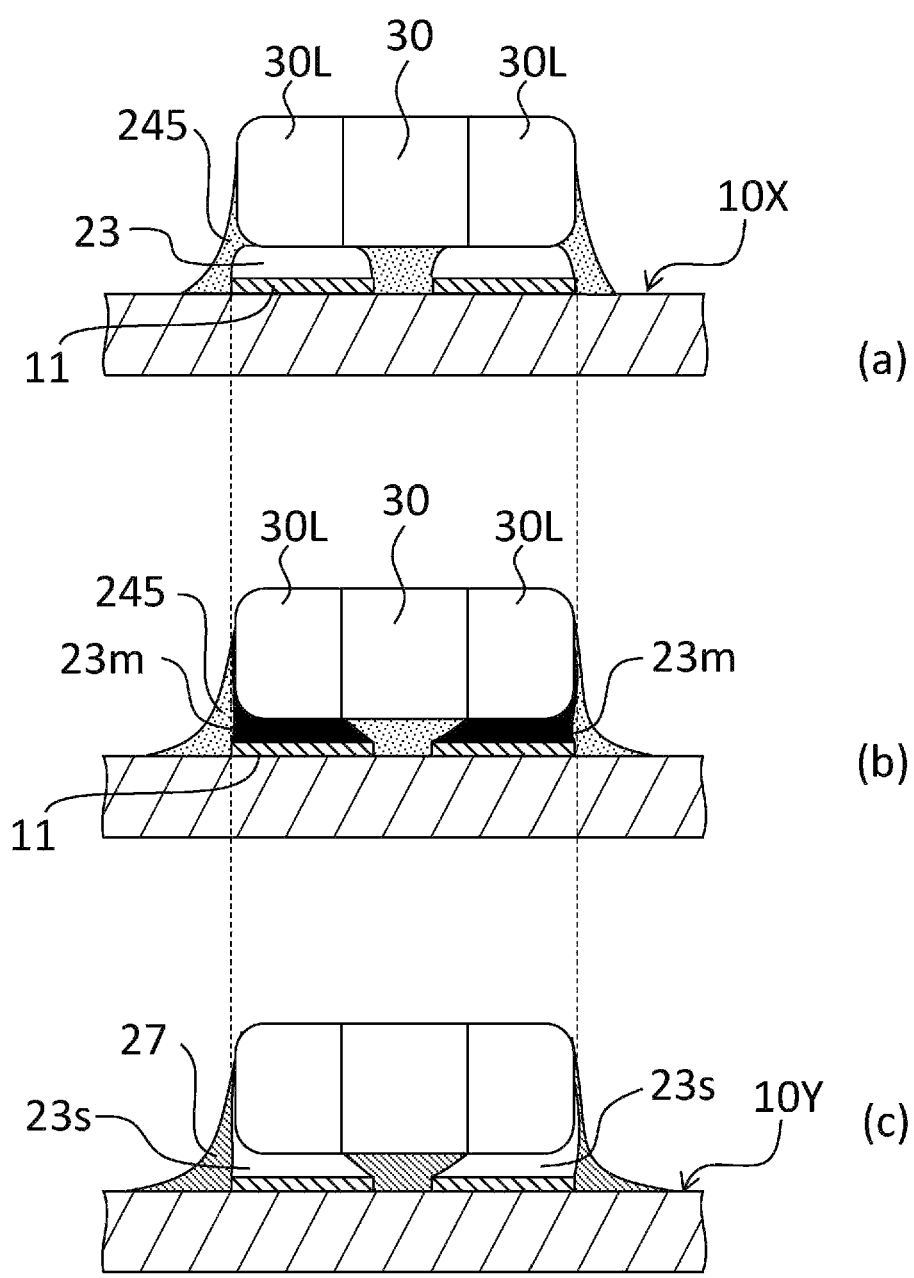
FIG. 3 A schematic diagram illustrating the rest of the process of mounting an electronic component on the circuit member having a solder precoat.

Next, the electronic component 30 is mounted on the circuit member 10X by reflow. FIG. 3 schematically illustrates the changes in the state of the solder precoat 23, the organic film 24, and the adhesive 25, during reflow.

FIG. 3(a) illustrates a state where the circuit member 10X in which the electronic component 30 is placed on the solder precoat 23 with the organic film 24 and the adhesive 25 interposed therebetween is introduced into a reflow apparatus, and heated therein, so that the organic film 24 and the adhesive 25 are liquefied and compatibilized with each other, forming one liquid phase 245. By heating, the organic film 24 and the adhesive 25 are softened and then liquefied. The adhesive 25 contains a sufficient amount of solvent. Until the compatibilization between the softened or liquefied adhesive 25 and the organic film 24 proceeds sufficiently, at least part of the solvent remains without volatilizing, in the liquid phase 245.

FIG. 3(b) illustrates a state where the solder precoat 23 is melted to form a molten solder 23m, and the molten solder 23m wets and spreads over the lead terminals 30L of the electronic component 30. That is, the electrodes 11 of the circuit member 10 and the lead terminals 30L of the electronic component 30 are connected to each other via the molten solder 23m. Note that when the electronic component is equal to or smaller than the 0402 size defined in the JIS standards and has a plurality of terminals (e.g., lead terminals 30L) to be connected to the solder precoat, the self-weight per one terminal of the electronic component is, for example, 0.05 mg or less. In this case, the amount of sinking of the terminal is small, which usually increases the difficulty in ensuring the connection via the molten solder 23m. It is important to allow the compatibilization between the adhesive 25 and the organic film 24 to proceed sufficiently, for securing the amount of sinking of the terminal and achieving favorable connection between the electrodes 11 and the lead terminals 30L.

FIG. 3(c) illustrates the circuit member 10Y after cooling, in which the solder is solidified, forming a solder joint portion 23s. The surface of the solder joint portion 23s is covered with a residue 27 of the organic film 24 and the adhesive 25. The residue 27 is subjected to cleaning, if necessary.

Next, a variant example of the method for producing an electronic component mounting substrate will be described.

Figure 4:
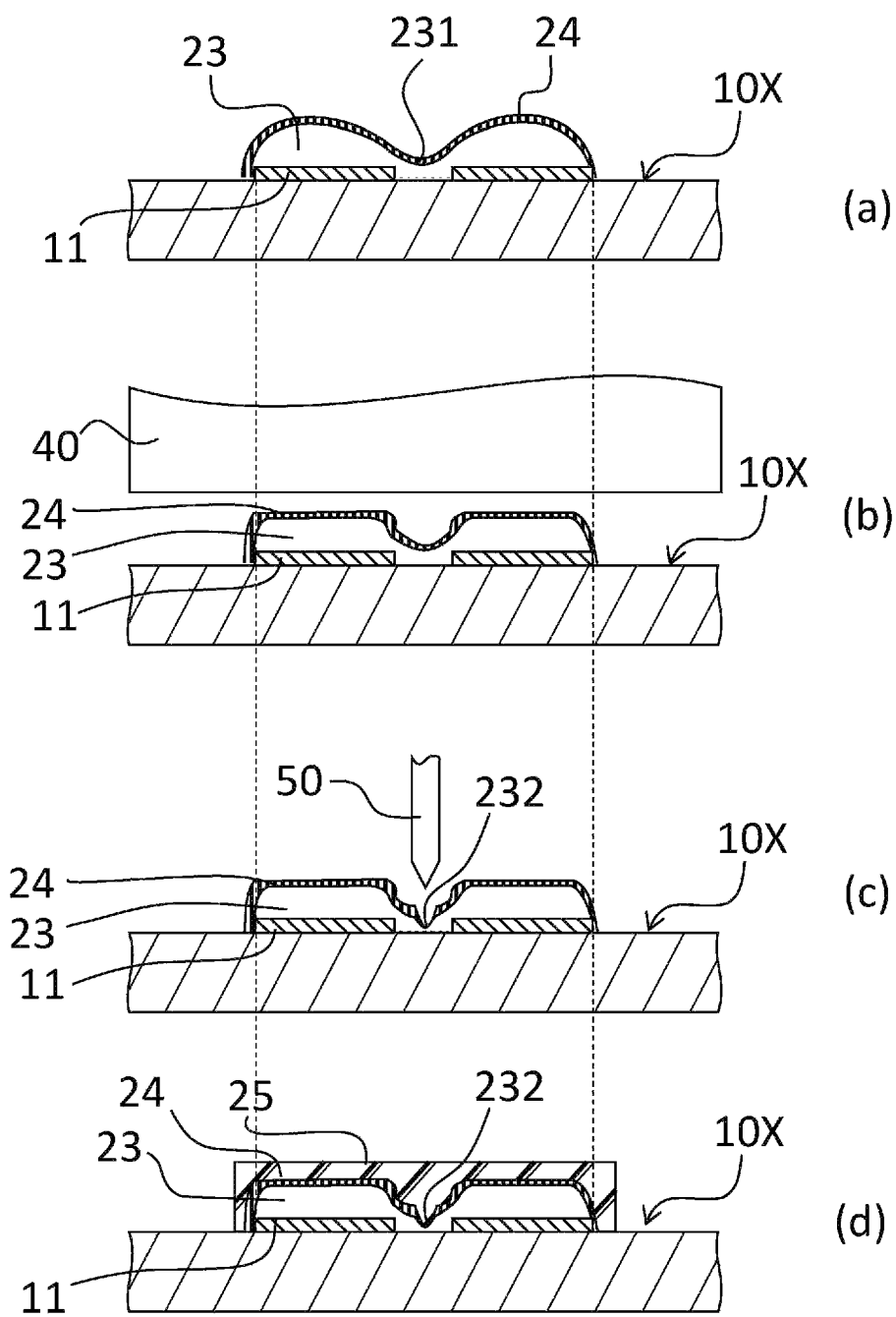
FIG. 4 A schematic diagram illustrating part of a process of mounting an electronic component on the circuit member having another solder precoat.

FIG. 4(a) illustrates the circuit member 10X having another solder precoat 23. The solder precoat 23 is formed between a pair of the electrodes 11, too, forming a bridge 231 between the pair of the electrodes 11. Since the electrodes 11 of the circuit member 10 are miniature, the bridge 231 as above can be formed when the solder precoat 23 is formed.

The bridge 231 can be eliminated in most cases, because it is attracted to the electrodes 11 and the lead terminals by the surface tension of the molten solder 23m, when the solder precoat 23 melts to form the molten solder 23m. However, when the electrode 11 is a miniature electrode for bonding the electronic component 30 which is equal to smaller than the 0402 size (e.g., 0402, 0201, 03015, 01005 size), eliminating the bridge 231 may become difficult under the influence of the organic film 24. The adhesive 25 used in the present embodiment contains a sufficient amount of solvent. Therefore, the organic film 24 is relatively easily converted to the liquid phase 245, but it is beneficial to establish a process that can more reliably eliminate the bridge 231.

In the present variant example, after the process of flattening the solder precoat 23 illustrated in FIG. 4(b), as shown in FIG. 4(c), a notch 232 is formed at the center of the bridge 231, using the tip of a blade member 50 having a pointed end. Then, the adhesive 25 is applied onto the solder precoat 23, with the organic film 24 interposed therebetween (FIG. 4(d)), and the electronic component 30 is placed on the solder precoat 23, with the organic film 24 and the adhesive 25 interposed therebetween (FIG. 5(a)).

Figure 5:
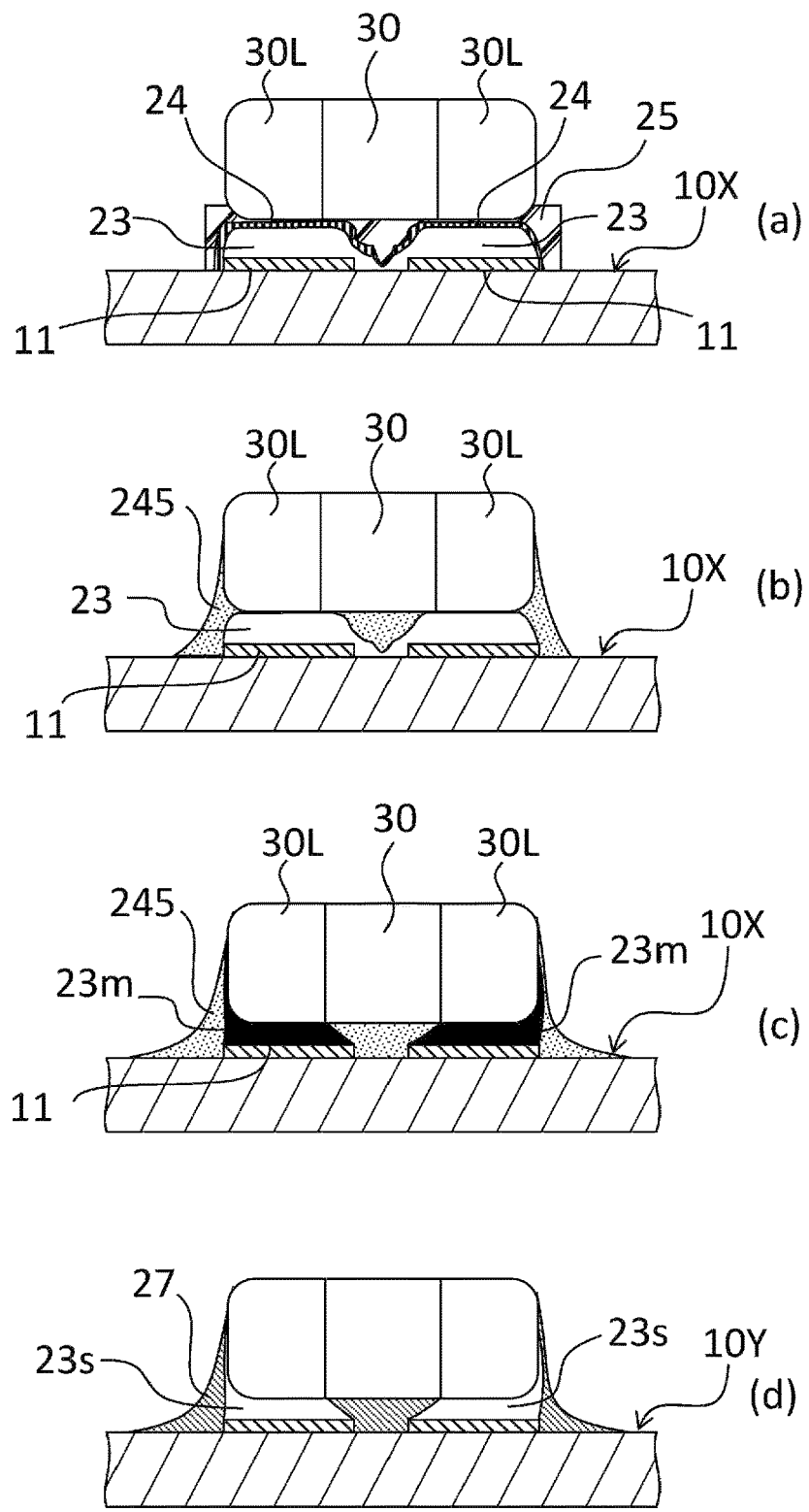
FIG. 5 A schematic diagram illustrating the rest of the process of mounting an electronic component on the circuit member having another solder precoat.

Next, when the circuit member 10X is introduced into a reflow apparatus, the organic film 24 and the adhesive 25 are liquefied, to form the liquid phase 245 (FIG. 5(b)). When the solder precoat 23 is melted to form the molten solder 23m, the molten solder 23m wets and spreads over the lead terminals 30L of the electronic component 30, and, starting from the notch 232, is easily divided and separated as shown in FIG. 5(c). Therefore, when the solder is solidified and the solder joint portions 23s by the solder are formed, a circuit member similar to a circuit member Y as illustrated in FIG. 3(c) is obtained (FIG. 5(d)).

The adhesive according to the present disclosure will be further described below by way of Examples. The following Examples, however, are not intended to limit the present invention.

Example 1

(1) Preparation of Circuit Member

A solder precoat 23 was formed on a substrate having an electrode 11 for mounting an electronic component (0402-size chip capacitor), to prepare a circuit member 10. The solder paste, which is the raw material of the solder precoat 23, is a mixture of solder particles (average particle diameter: 20 μm, melting point: 217° C.) and a flux, with the solder particle content of 90 mass %. The major component of the flux is a rosin-based resin. The surface of the solder precoat 23 is covered with a reside of the flux (organic film 24).

(2) Preparation of Adhesive

To 60 parts by mass of a rosin-based resin serving as a principal resin, 20 parts by mass of adipic acid serving as an activator, and 10 parts by mass of hydrogenated castor oil serving as a thixotropic agent were added, and hexyl carbitol serving as a solvent was added so that its content relative to the adhesive was in the range of 10 mass % to 50 mass % as shown in Table 1, to prepare a plurality of adhesives 25.

(3) Evaluation (3-1) Tack Test

The adhesive force of the adhesive was evaluated in accordance with JIS Z 3284-3 as already described. Here, a predetermined amount of the adhesive was printed on a test ceramic plate using a mask. A probe was pressed against the adhesive, and then pulled up to measure the force when peeled off. For the tack force tester, "TK-1" manufactured by Malcom Co., Ltd. was used. The results are shown by the following indicators in Table 1.

less than 0.5 N: poor 0.5 N or more and less than 1.0 N: fair 1.0 N or more: good (3-2) Compatibility The adhesive 25 was screen-printed on the solder precoat 23, with the organic film 24 interposed therebetween, and an electronic component 30 was placed on the adhesive 25. Then, the solder was reflowed to complete the mounting of the electronic component 30, and the shear strength of the solder joint portion was evaluated. When the compatibility is low, the molten solder and the lead terminals of the electronic component (chip capacitor) cannot sufficiently come in contact with each other, or the lead terminals cannot sufficiently sink down, resulting in a low shear strength. For the measuring instrument, a universal bond tester "4000plus" manufactured by Nordson Advanced Technology Co., Ltd. was used, and the value when the chip capacitor was sheared from the long side was evaluated according to the following indicators.

less than 0.3 N: poor 0.3 N or more and less than 0.7 N: fair 0.7 N or more: good

TABLE 1

| | A | B | C | D | E | F | G | H | I |
|---|---|---|---|---|---|---|---|---|---|
| solvent content (mass %) | 10 | 15 | 20 | 25 | 30 | 35 | 40 | 45 | 50 |
| shear strength | fair | fair | fair | good | good | good | good | good | good |
| tack force | good | good | good | good | good | good | good | fair | fair |

Table 1 shows that when the content of the solvent in the adhesive is 25 mass % or more and 40 mass % or less, an adhesive having an excellent balance between the compatibility with the organic film and the tack force can be obtained.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

INDUSTRIAL APPLICABILITY

The present disclosure is useful in the field of producing an electronic component mounting substrate by placing an electronic component on a circuit member having a solder precoat. The present disclosure is particularly useful for producing an electronic component mounting substrate, using a miniature component equal to or smaller than the 0402 size, or an electronic component the self-weight (weight) of which per one terminal is 0.05 mg or less.

[Reference Signs List]

10, 10X, 10Y: circuit member
11: electrode
12: mask
12a: opening
20: solder paste
21: solder particles
22: flux
23: solder precoat
23m: molten solder
23s: solder joint portion
231: bridge
232: notch
24: organic film
245: liquid phase
25: adhesive
27: residue
30: electronic component

[Reference Signs List]

30L: lead terminal
40: jig with flat pressing surface
50: blade member

What is claimed is:

1. A method for producing a circuit member on which an electronic component is mounted, the method comprising steps of:
preparing the circuit member, the circuit member having a solder precoat covered at least partially with an organic film;
applying an adhesive for temporarily fixing the electronic component on the solder precoat, so as to cover at least part of the organic film;
placing the electronic component on the solder precoat, with the adhesive interposed between the electronic component and the solder precoat; and
reflowing the solder precoat, to mount the electronic component on the circuit member; wherein
the adhesive includes a principal resin, and a solvent dissolving the principal resin,
a content of the solvent is 25 mass % or more and 40 mass % or less, and
the organic film dissolves in the solvent when the solder precoat is reflowed.

2. The method according to claim 1, wherein the organic film contains an antioxidant.

3. The method according to claim 1, wherein the organic film contains a residue produced during formation of the solder precoat.

4. The method according to claim 1, wherein the adhesive further contains an activator that reduces an oxide film covering a surface of the solder precoat.

5. The method according to claim 1, wherein the electronic component is equal to or smaller than a 0402 size defined in JIS standards.

6. The method according to claim 1, wherein the electronic component has a plurality of terminals to be connected to the solder precoat, and a self-weight of the electronic component per one terminal is 0.05 mg or less.

* * * * *